(12) United States Patent
Deas et al.

(10) Patent No.: US 10,674,298 B2
(45) Date of Patent: Jun. 2, 2020

(54) MEMS DEVICE AND PROCESS

(71) Applicant: Cirrus Logic International Semiconductor Ltd., Edinburgh (GB)

(72) Inventors: James Thomas Deas, Edinburgh (GB); Scott Lyall Cargill, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/136,939

(22) Filed: Sep. 20, 2018

(65) Prior Publication Data

US 2019/0020962 A1 Jan. 17, 2019

Related U.S. Application Data

(63) Continuation of application No. 15/660,508, filed on Jul. 26, 2017, now Pat. No. 10,111,021.

(Continued)

(30) Foreign Application Priority Data

Oct. 4, 2016 (GB) .................................. 1616860.1

(51) Int. Cl.
*A61F 11/06* (2006.01)
*G10K 11/16* (2006.01)
*H03B 29/00* (2006.01)
*H04R 31/00* (2006.01)
*B81C 1/00* (2006.01)
(Continued)

(52) U.S. Cl.
CPC ......... *H04R 31/006* (2013.01); *B81B 3/0021* (2013.01); *B81C 1/00158* (2013.01); *H04R 9/046* (2013.01); *H04R 19/005* (2013.01);

*H04R 19/02* (2013.01); *H04R 19/04* (2013.01); *B81B 2201/0257* (2013.01);
(Continued)

(58) Field of Classification Search
CPC .... H04R 31/006; H04R 9/046; H04R 19/005; B81B 3/0021; B81C 1/00158
See application file for complete search history.

(56) References Cited

U.S. PATENT DOCUMENTS 5,888,412 A 3/1999 Sooriakumar et al.
2006/0082256 A1* 4/2006 Bibl ..................... B41J 2/14233
310/328

(Continued)

FOREIGN PATENT DOCUMENTS

EP 2535310 A2 6/2012
KR 100923296 B1 10/2009
(Continued)

OTHER PUBLICATIONS

Combined Search and Examination Report under Sections 17 and 18(3), UKIPO, Application No. GB1616860.1, dated Nov. 11, 2016.
(Continued)

*Primary Examiner* — Simon King
(74) *Attorney, Agent, or Firm* — Jackson Walker L.L.P.

(57) ABSTRACT

The application describes a MEMS transducer in which first and second conductive elements of a capacitor are both provided on the membrane. The membrane is shaped such that the first and second conductive elements are displaced relative to each other when the flexible membrane deflects in response to a pressure differential across the membrane. For example the membrane may be corrugated.

18 Claims, 7 Drawing Sheets

Related U.S. Application Data

(60) Provisional application No. 62/367,997, filed on Jul. 28, 2016.

(51) Int. Cl.
*H04R 9/04* (2006.01)
*H04R 19/00* (2006.01)
*B81B 3/00* (2006.01)
*H04R 19/02* (2006.01)
*H04R 19/04* (2006.01)

(52) U.S. Cl.
CPC ... *B81B 2203/0127* (2013.01); *B81B 2203/04* (2013.01); *H04R 2201/003* (2013.01); *H04R 2499/11* (2013.01)

(56) References Cited

U.S. PATENT DOCUMENTS

| | | | |
|---|---|---|---|
| 2008/0104825 A1* | 5/2008 | Dehe | H04R 19/005 |
| | | | 29/594 |
| 2010/0072561 A1 | 3/2010 | Lee et al. | |
| 2010/0164025 A1 | 7/2010 | Yang | |
| 2010/0171153 A1 | 7/2010 | Yang | |
| 2010/0330722 A1 | 12/2010 | Hsieh et al. | |
| 2011/0182450 A1* | 7/2011 | Chung | H04R 17/005 |
| | | | 381/190 |
| 2011/0241137 A1 | 10/2011 | Huang et al. | |
| 2012/0090398 A1 | 4/2012 | Lee et al. | |
| 2013/0264663 A1 | 10/2013 | Dehe et al. | |
| 2013/0329920 A1 | 12/2013 | Grosh et al. | |
| 2015/0058001 A1* | 2/2015 | Dai | H04R 3/00 |
| | | | 704/231 |
| 2015/0132880 A1 | 5/2015 | Hsieh et al. | |
| 2016/0286319 A1* | 9/2016 | Kupershmidt | H04R 19/02 |
| 2017/0029268 A1* | 2/2017 | Chang | B81B 3/0072 |
| 2017/0142525 A1* | 5/2017 | Glacer | H04R 31/00 |

FOREIGN PATENT DOCUMENTS

| | | |
|---|---|---|
| WO | 2004036952 A2 | 4/2004 |
| WO | 2016008106 A2 | 1/2016 |
| WO | 2016029358 A1 | 3/2016 |

OTHER PUBLICATIONS

Zhou, et al., Design and Fabrication of Silicon Condenser Microphone Using Corrugated Diaphragm Technique, Journal of Microelectromechanical Systems, vol. 5, No. 3, Sep. 1996, 8 pages.
International Search Report and Written Opinion of the International Searching Authority, International Application No. PCT/GB2017/052052, dated Sep. 27, 2017.
Examination Opinion, Taiwan Patent Office, Application No. 106124645, dated Sep. 20, 2018.
Examination Report under Section 18(3), UKIPO, Application No. GB1616860.1, dated Sep. 18, 2018.

* cited by examiner

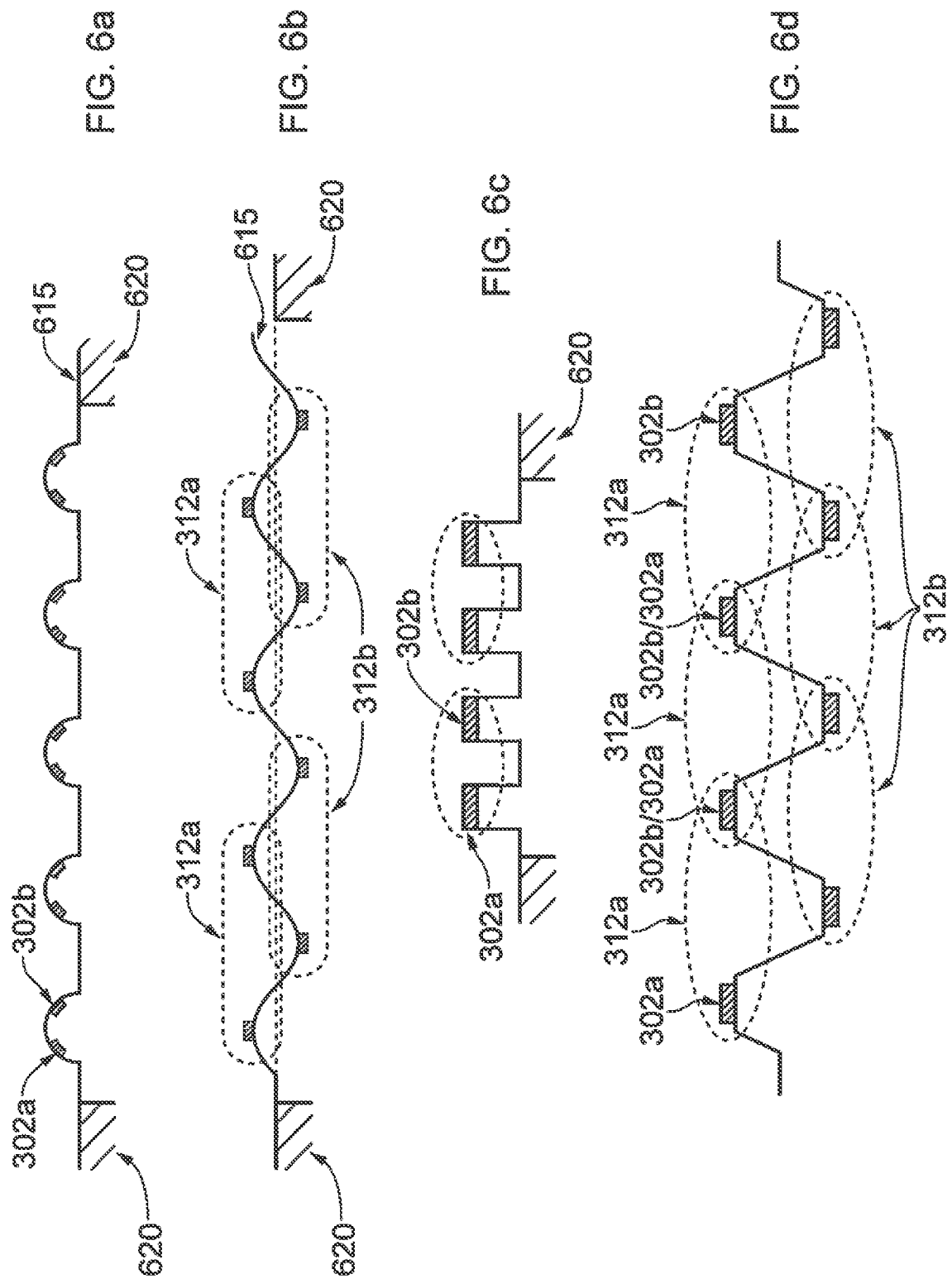

MEMS DEVICE AND PROCESS

This application is a continuation of U.S. patent application Ser. No. 15/660,508, filed Jul. 26, 2017, which claims priority to U.S. Provisional Patent Application Ser. No. 62/367,997, filed Jul. 28, 2016, and United Kingdom Patent Application No. GB1616860.1, filed Oct. 4, 2016, each of which are incorporated by reference herein in its entirety.

FIELD OF DISCLOSURE

This invention relates to a micro-electro-mechanical system (MEMS) device and process, and in particular to a MEMS device and process relating to a transducer, for example a capacitive microphone or speaker.

BACKGROUND

Various MEMS devices are becoming increasingly popular. MEMS transducers, including MEMS capacitive receivers, such as microphones, and capacitive transmitters, such as speakers are increasingly being used in portable electronic devices such as mobile telephones and portable computing devices.

Transducer devices formed using MEMS fabrication processes typically comprise one or more membranes with electrodes for read-out/drive deposited on the membranes and/or a substrate. In the case of MEMS pressure sensors and microphones, for example, the read out is usually accomplished by measuring the capacitance between an electrode on a flexible membrane and an electrode on a rigid backplate which will vary as the distance between the electrodes changes as the membrane flexes in response to sound waves incident on the membrane surface.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

MEMS transducers therefore rely on the electrical property of capacitance between the pair of electrodes. Displacement of the membrane electrode (102) relative to the back-plate electrode (103) in response to a sound wave corresponding to a pressure wave incident on the membrane gives rise to a change in distance between the two electrodes. This change in distance can be detected and measured, by means of electronic circuitry (not shown), as a change in capacitance between the two electrodes.

Thus, the measurable change in capacitance is related to the change in distance between the two electrodes according to the relation:

$$C \propto 1/d$$

In known MEMS transducers, one electrode is coupled to the flexible membrane and the other electrode is located on, or is part of, a substantially rigid back-plate. As the flexible membrane deflects in response to a pressure differential across the membrane, the membrane electrode is correspondingly displaced relative to the substantially stationary back-plate electrode.

It will be appreciated that such an arrangement may suffer from a number of disadvantages. For example, it will be appreciated that the back-plate structure may be a significant source of acoustic noise which is detectable by the capacitive sensor of the transducer. For example, the acoustic holes 112 present in the back-plate 104 may cause noise due to their acoustic resistance. Additionally, the geometry of the acoustic volume between the membrane and the back-plate may cause noise. Also, the electrostatic forces between the back-plate and membrane may vary with displacement, causing non-linearity in the displacement relative to applied acoustic pressure and hence distortion in the electrically sensed output.

SUMMARY

Embodiments of the present invention seek to provide an alternative transducer design which seeks to improve known transducer designs. In particular, preferred embodiments are concerned with seeking to reduce noise arising in a MEMS transducer.

According to a first aspect of the present invention there is provided a MEMS transducer comprising: a flexible membrane provided with an electrode pair, the electrode pair comprising first and second conductive elements, wherein the flexible membrane is shaped such that the first and second conductive elements are displaced relative to each other when the flexible membrane deflects in response to a pressure differential across the membrane.

Thus, according to embodiments of the present invention, the first and second conductive elements forming an electrode pair are both provided on, or are provided as part of, the flexible membrane. Due to the shape of the membrane, which may be non-planar, displacement of the flexible membrane causes the elements to be displaced relative to each other. Thus, the distance between the first and second conductive elements changes and can be detected and measured as a change in capacitance. A pressure differential across the membrane due to a sound wave incident on the transducer is therefore measured as a change in capacitance between the first and second conductive elements—both of which are located on or as part of the flexible membrane.

An advantage of this arrangement is that the need to provide a second electrode at a fixed distance from the membrane is mitigated. Thus, transducer structures having fewer parts, and exhibiting a reduction in the overall height of the transducer structure are envisaged. Furthermore, the possibility of omitting the backplate structure and thus eliminating a significant source of acoustic noise is envisaged.

The membrane is preferably shaped to define at least one ridge and/or groove. Each ridge or groove may comprise a pair of first and second side-walls. The conductive elements of the electrode pair(s) may be provided on said side-walls. According to one embodiment the first side-wall of said ridge is provided with one of said first and second conductive elements and the second side-wall of the same ridge is provided with the other of said first and second conductive elements. According to another embodiment each ridge/groove comprises a peak and the conductive elements of the electrode pairs are provided on the peaks of the ridges and/or grooves of the flexible membrane.

The flexible membrane may be supported relative to a substrate of the transducer, at or near the periphery of the membrane, by means of a support structure. The support structure may, for example, comprise a plurality of mounts. A notional "main plane" of the flexible membrane—which is shaped to define at least one ridge and/or groove—can be defined as the plane over which the surface of the equivalent, entirely planar, membrane would extend between the peripheral support structures. Thus, a ridge can be considered to project "above" the notional main plane of the membrane. Furthermore, a groove may be considered to project "below" the notional main plane of the flexible membrane.

A ridge/groove can be considered to be formed of a pair of sidewalls. The sidewalls thus extend from the notional main plane of the membrane towards a peak of the ridge/groove. The membrane preferably comprises a plurality of ridges and/or grooves. According to a particularly preferred embodiment, the membrane comprises a series of alternate ridges and grooves. Thus, the membrane may be corrugated in form.

The membrane may be shaped to define a smooth, generally sinuous, waveform. Alternatively, the membrane may be shaped to define a generally triangular waveform. Thus, when considering a cross section through the membrane, the pair of sidewalls of the, or each, ridge/groove intersect at a point which forms the peak of the ridge/groove. Alternatively, the membrane may be shaped to define a generally square waveform. Thus, when considering a cross section through the membrane, the pair of sidewalls of the each ridge/groove do not intersect and instead intersect a plane defining the peak of the, or each, ridge/groove.

Thus, the membrane may be shaped to include plurality of ridges and/or grooves. When considering the planar membrane in 3-dimensions, the peaks of the ridges and/or grooves may define a longitudinal peak axis which extends across the membrane. Preferably, the membrane is formed such that the peak axes of the plurality of ridges and/or grooves are arranged so as to be substantially parallel to each other.

The plurality of longitudinal peak axes series can be seen to progress or extend linearly across the membrane.

Alternatively, the membrane may be formed such that a peak of the ridge and/or groove defines a closed circle or polygon. A plurality of closed circles/polygons formed from the peaks can be considered to progress radially from substantially the centre of the membrane. The size of the closed circle/polygon may increase from a smallest circle/polygon at or near the centre of the membrane to a largest circle/polygon at the periphery of the membrane.

According to one embodiment, the membrane comprises at least two ridges or at least two grooves, wherein one of said first and second conductive elements is provided on one said ridge/groove, which is a first ridge/groove, and the other of said first and second conductive elements is provided on another said ridge/groove which is adjacent to said first ridge/groove.

Transducer designs have been considered which facilitate the determination of a differential measurement of capacitance, thereby enabling some noise sources to be filtered by common mode rejection. For example, transducer structures composed of two back-plates have been proposed. However, this design introduces further noise and is complex to manufacture.

Preferred embodiments of the present invention seek to enable the generation of a differential measurement of capacitance so that processing of the transducer output can eliminate noise—in particular electrical noise—by means of well-known techniques of common mode rejection.

Preferably, there the MEMS transducer comprises a plurality of electrode pairs. The plurality of electrode pairs may be located on the membrane so as to form a single set of electrode pairs. Thus, the transducer is arranged/operable to provide a single output signal representing the change in capacitance between first and second conductive elements of the single set of electrode pairs.

Alternatively, the plurality of electrode pairs may be located on the membrane so as to form first and second sets of electrode pairs. Thus, the transducer is arranged/operable to provide corresponding first and second output signals representing the change in capacitance between first and second conductive elements of each respective set.

A bias voltage is applied to one or more of the conductive elements of each electrode pair. The conductive elements may comprise a metal material.

According to a second aspect of the present invention there is provided a MEMS transducer comprising a flexible membrane formed of a plurality of ridges and/or grooves, wherein the ridges and/or grooves are provided with at least one electrode pair, each electrode pair comprising a first and second conductive element, and wherein the first and second conductive elements of a given electrode pair are displaced relative to each other when the flexible membrane deflects in response to a pressure differential across the membrane.

According to a third aspect of the present invention there is provided a MEMS transducer comprising a non-planar flexible membrane.

It will be appreciated that although a backplate structure is not required for supporting one of a pair of capacitive plates of the transducer, there may still be a need to provide a backplate or other cover structure for purposes of robustness e.g. to provide a backstop for the membrane in circumstances of a high pressure event. However, such a structure would preferably be modified to mitigate the impact on the noise performance of the transducer e.g. by increasing the size of the backplate holes.

The transducer may be a capacitive sensor, such as a microphone, or a speaker. The transducer may comprise readout, i.e. amplification, circuitry. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

Features of any given aspect may be combined with the features of any other aspect and the various features described herein may be implemented in any combination in a given embodiment.

Associated methods of fabricating a MEMS transducer are provided for each of the above aspects.

According to a further aspect of the present invention there is provided a method of fabricating a non-planar flexible membrane comprising at least one conductive element, comprising:
  forming a first cavity in the upper surface of a substrate;
  providing a first sacrificial layer of material within the cavity;
  providing a first layer of conductive/metal material on top of the sacrificial layer within the cavity and patterning said layer of conductive/metal material to define at least one said conductive element;
  providing a second sacrificial layer of material within the cavity and removing the second sacrificial layer in regions overlying the conductive element to define a second cavity (within the first cavity) above said conductive element;
  depositing a layer of membrane material over the first cavity including over the second cavity to form a corrugated membrane layer.

Methods embodying the further aspect of the present invention result in the formation of a non-planar membrane layer having a corrugation (a corrugated membrane layer), wherein a conductive element is provided on the underside of the corrugation. Thus, the first layer of conductive metal material is for forming at least one conductive elements on the "underside" of the membrane layer.

Preferably, the method further comprises:
  providing a second layer of conductive/metal material on top of the corrugated membrane layer; and
  patterning the second layer of conductive/metal material to define at least one further conductive element.

This results in the formation of a non-planar membrane layer having at least one conductive element provided on both the "upper" and "lower" surfaces of the corrugated membrane layer.

The method preferably also comprises:
  forming a cavity in the lower surface of the substrate; and
  removing the first and second sacrificial layers to release the corrugated layer of membrane material.

BRIEF DESCRIPTION OF THE DRAWINGS

For a better understanding of the present invention and to show how the same may be carried into effect, reference will now be made by way of example to the accompanying drawings in which:

FIGS. 6a to 6d illustrate in cross-section a number of membrane designs according to various examples embodying the present invention;

Throughout this description any features which are similar to features in other figures have been given the same reference numerals.

DESCRIPTION

Embodiments of the present invention relate to MEMS transducers comprising a non-planar flexible membrane.

Figure 1A:
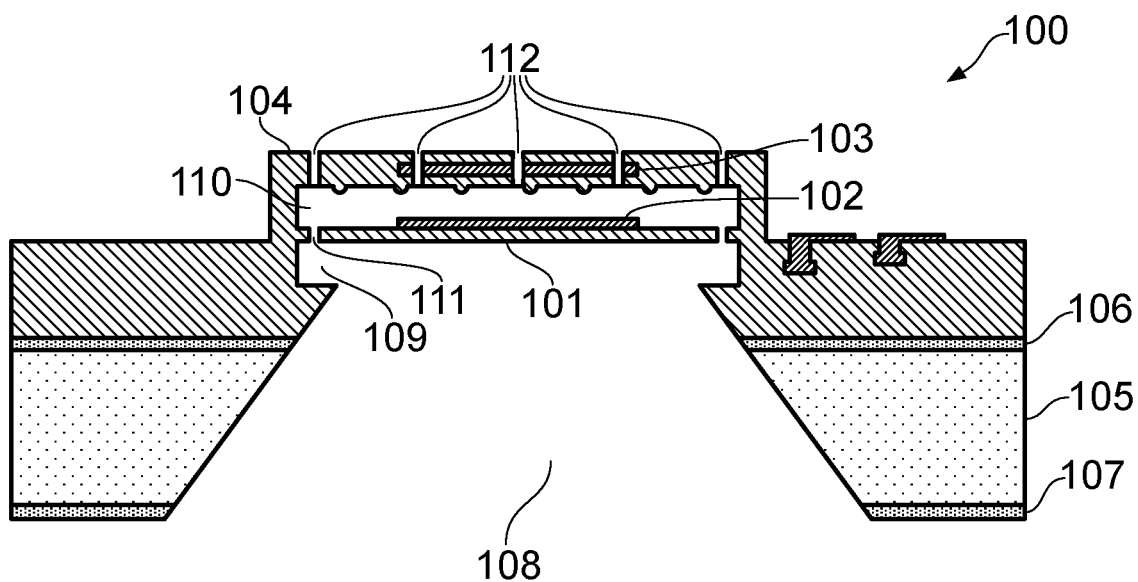
FIGS. 1a and 1b illustrate known capacitive MEMS transducers in section and cut-away perspective views.
Figure 1B:
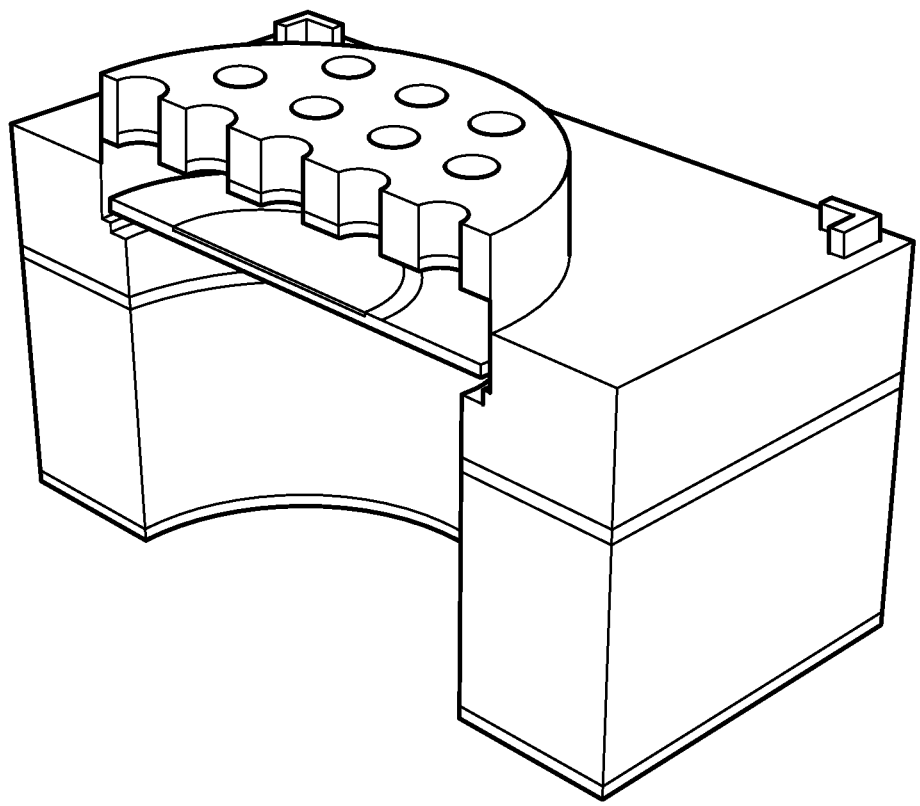
Figure 2:
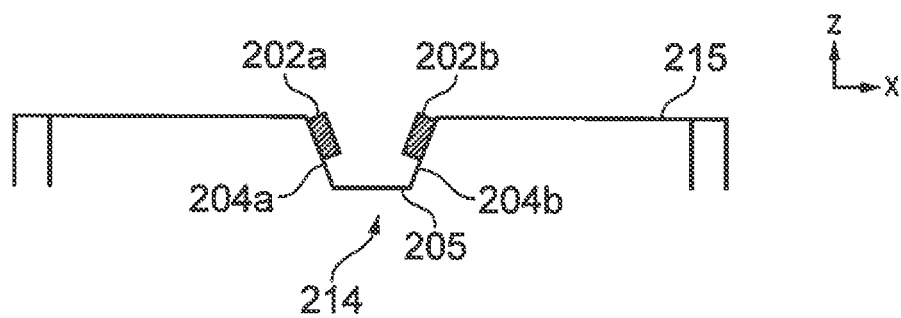
FIG. 2 is a sectional view of a flexible membrane according to one example embodiment.

FIG. 2 illustrates a cross-section through a flexible membrane 215 according to a first example embodiment. The membrane comprises a groove 214 formed of a pair of sidewalls 204a and 204b which extend from the surface of the membrane to a peak of the groove in the form of planar surface 205. In this particular example, the groove projects "below" the main planar surface of the membrane. However, it will be appreciated that the FIG. 2 embodiment could similarly comprise a ridge which projects "above" the main planar surface of the membrane. Thus, the membrane can be considered to exhibit a change or discontinuity in the z-dimension (i.e. orthogonal to the plane of the membrane defined in the x and y dimensions) as illustrated in FIG. 2. The membrane 215 is provided with first and second conductive elements 202a and 202b which are respectively provided on the first and second sidewalls 204a and 204b of the groove.

In use the electrodes are connected to circuitry (not shown) which allows the capacitance to be measured.

When a pressure wave due to acoustic noise is incident on the flexible membrane 215, the membrane is displaced from its equilibrium position. A displacement of the membrane results in a corresponding displacement in the distance between the conductive elements 202a and 202b, which is measurable as a change of capacitance. For example, an upward displacement of the flexible membrane 215 will cause a separation of the two conductive elements, resulting in a measurable reduction in the capacitance arising between the conductive elements. The measured change in capacitance allows the change in distance between the elements, and thus the amount of displacement of the membrane to be determined.

The FIG. 2 design represents an alternative membrane structure wherein a pair of capacitive plates—or conductive elements—are provided on, or associated with, the membrane. This facilitates the generation of measurable capacitance laterally across the membrane as first and second conductive elements are provided a different lateral positions with respect to the notional plane of the membrane.

According to this embodiment, the need for a fixed electrode positioned above the membrane—e.g. as part of a backplate structure—is mitigated. This enables the possibility of a transducer configuration according to which the usual backplate structure, or other support structure for the fixed electrode, may be omitted. Such a transducer configuration will benefit from a significant reduction in acoustic noise.

Figure 3A:
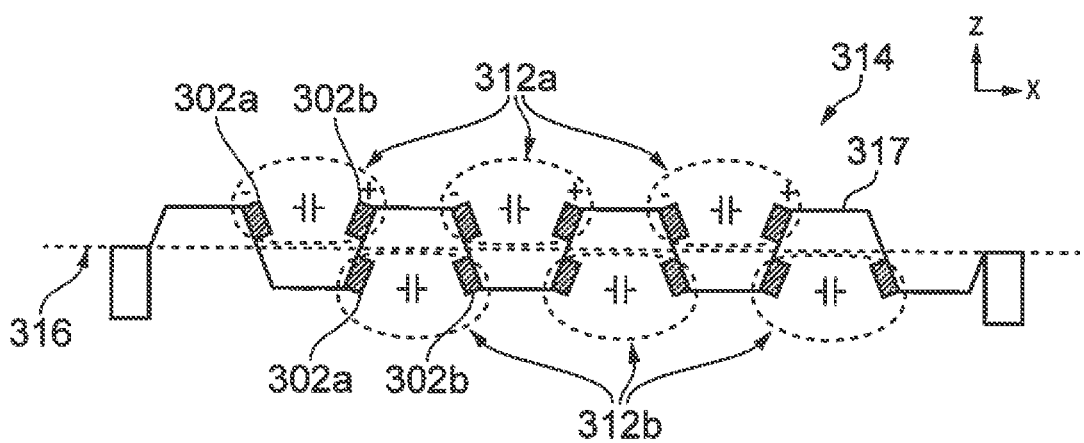
FIGS. 3a to 3c provide various views of a flexible membrane according to another example embodiment.

FIG. 3a illustrates a cross-section through a membrane substantially in the equilibrium position according to a further embodiment of the present invention. The membrane 314 comprises a plurality of alternate ridges and grooves which project above and below a notional main plane 316 of the membrane. Each of the ridges and grooves comprises a pair of sloped sidewalls. The membrane exhibits a generally square-wave shape. The peak of each ridge/groove comprises a substantially planar surface 317 which extends longitudinally across the membrane. This can be seen more clearly from FIG. 3c which is a perspective view of a part of the membrane 314.

The membrane 314 comprises a plurality of electrode pairs 312—each comprising first and second conductive elements 302a and 302b—which are indicated in FIG. 3 by the dashed lines. It will be appreciated that the conductive elements may belong to only one electrode pair, as shown in FIG. 3a or, alternatively, one or more of the conductive elements may belong to more than one electrode pair—i.e. a conductive element may be shared by two or more electrode pairs. This will be determined by the associated circuitry and the manner in which the conductive elements are connected for readout. The electrode pairs form two sets of electrode pairs 312a and 312b.

In this embodiment, first and second conductive elements forming an electrode pair are located on the sidewalls of the ridges/grooves so as to be substantially facing one another. When the membrane is considered at the equilibrium position, as shown in FIG. 3a, the conductive elements of each conductive pair in a given set are provided at substantially the same offset from the notional main plane of the membrane 316. Thus, the first set of electrode pairs 312a is offset in the +z direction and the second set of electrode pairs 312b are offset by the same distance in the −z direction.

In use, a bias voltage is applied to one or both of the first and second conductive elements. The potential difference applied across each of the electrode pairs may be the same or different.

Figure 3B:
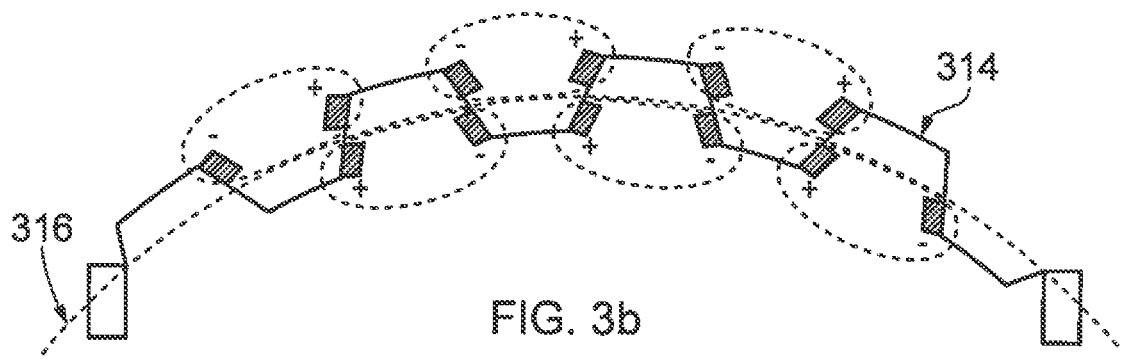
Figure 3C:
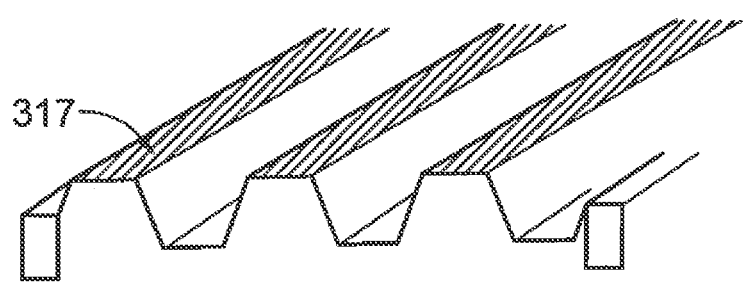

Again, when a pressure wave due to acoustic noise is incident on the flexible membrane 315, the membrane is displaced from its equilibrium position. FIG. 3b shows the membrane 315 when it has been displaced upwardly from equilibrium in the +z direction. Following displacement of the membrane as shown in FIG. 3b, the notional main plane of the membrane 316 can be considered to be distorted into an arc which extends between the peripheral supporting edge of the membrane. The conductive elements forming the first set of electrode pairs 312a have been displaced such that the distance between respective first and second conductive elements of an electrode pair has increased. Conversely, the conductive elements forming the second set of electrode pairs 312b have been displaced such that the distance between the respective first and second conductive elements of an electrode pair has decreased.

Figure 4A:
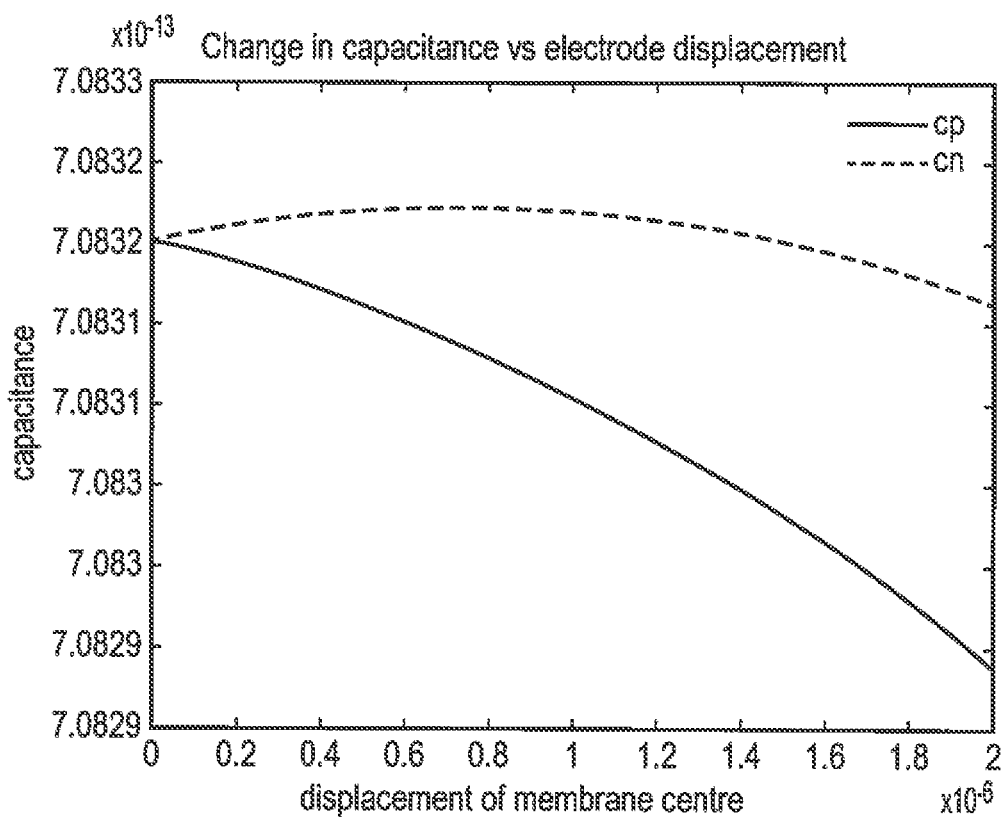
FIG. 4a shows a graphical representation of the change in capacitance of the first and second sets of electrode pairs shown in FIGS. 3a to 3c plotted against the displacement of the membrane.

Depending on the specific design e.g. dimensions relative to the notional plane, it will be noted that for small upwards displacements, the conductive elements forming the second set of electrode pairs may initially be displaced towards one another, giving an increase in capacitance, before continuing to be displaced away from one another, giving a decrease in capacitance, as the upward displacement of the membrane increases. The opposite will be true for downward deflection of the membrane in the −z direction. FIG. 4a shows a graphical representation of the change in capacitance of each of the first and second sets of electrode pairs vs. the displacement of the membrane at the centre of the membrane. The solid line represents the change in capacitance between the electrode pairs of the first set of electrode pairs 312a. The upper, broken line, represents the change in capacitance between conductive elements forming electrode pairs of the second set of electrode pairs 312b. Thus, from this it can be seen that the capacitance of the second set of electrode pairs initially increases and then starts to decrease.

A particular advantage of MEMS transducers incorporating a membrane as illustrated in this embodiment is that two outputs may be generated—one output which represents the change in capacitance between conductive elements of the first set of electrode pairs, and one output which represents the change in capacitance between conductive elements of the second set of electrode pairs. Thus, embodiments which incorporate a membrane provided with first and second sets of electrode pairs, for example as shown in FIG. 3, may be advantageously employed as a differential system. As will be appreciated, differential systems are advantageous in that they allow electrical noise generated from sources such as the transducer power supply or noise picked up from external electrical interference to be removed by e.g. common mode rejection whereby the two output signals generated from the respective changes in capacitance are applied to both inputs of differential amplifier and subtracted.

In addition, and as discussed with respect to the FIG. 2 embodiment, the need for a fixed second electrode, positioned relative to the membrane e.g. as part of a backplate, is mitigated as the change in capacitance can be obtained from the electrode pairs provided on the membrane. Thus, the FIG. 3a embodiment facilitates the generation of a differential signal—and thus the rejection of electrical noise present in both output signals—as well as a reduction in the acoustic noise that would otherwise be introduced by the provision of a structure such as a backplate which supports the fixed electrode. This is particularly beneficial when compared with previously considered transducer designs which facilitate the generation of a differential signal. Such prior designs typically utilise a second backplate structure to support a third fixed electrode, such that displacement of the membrane electrode is measured with respect to the second fixed electrode provided in the first backplate structure (first output signal) and with respect to the third fixed electrode provided in the second backplate structure (second output signal) However, although the prior design achieves a doubling of the obtained output signal, and thus may improve the signal to noise ratio (SNR), this improvement may be undermined by the increase in noise that is a consequence of the additional backplate structure.

Figure 4B:
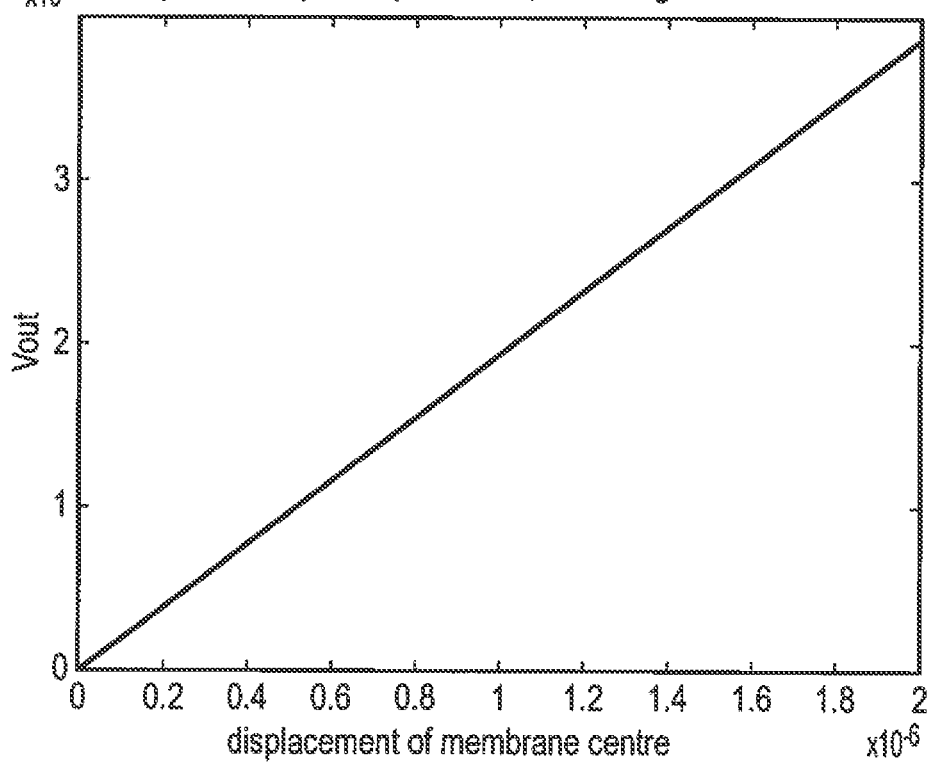
FIG. 4b shows a graphical representation of the differential voltage signal obtained from the two plots shown in FIG. 4a plotted against the displacement of the membrane.

The difference between the output signals generated by the first and second sets of electrode pairs can thus be processed to obtain a differential signal. FIG. 4b shows a graphical representation of the differential voltage signal obtained from the two plots shown in FIG. 4a plotted against the displacement of the membrane centre. It is noted that the difference between the capacitances of the first and second sets of electrode pairs will continue to grow even when the second set of electrode pairs are being initially displaced towards each other and then subsequently being displaced apart. It can be seen from FIGS. 4a and 4b that although the distances between the conductive elements of the first and second sets of electrode pairs does not vary linearly with membrane displacement, the difference between them does.

The properties of the membrane will affect the performance e.g. sensitivity of the transducer device. For example, the depth and/or width of the ridges/grooves, the stiffness and/or thickness of the membrane material, and the overall shape of the membrane area all parameters which may affect the distance that the first and second conductive elements may be. This, in turn will affect the sensitivity of the transducer device. Embodiments of the present invention are envisaged in which the various membrane properties are selected for a particular sensitivity of the required transducer device and/or for a particular application of the required transducer device.

Figure 5A:
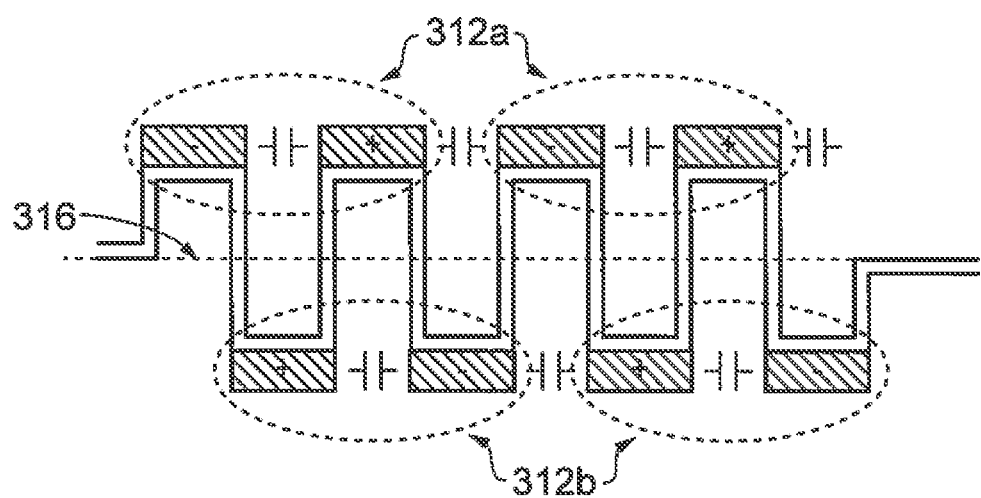
FIGS. 5a and 5b show a cross-section through a membrane according to a further embodiment of the present invention.
Figure 5B:
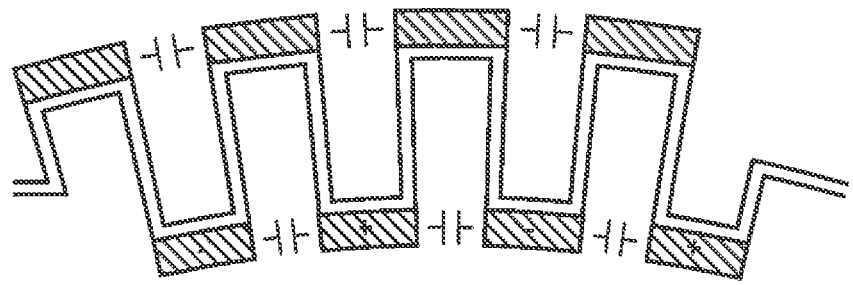

FIGS. 5a and 5b show a cross-section through a membrane according to a further embodiment of the present invention. The membrane is corrugated in form and thus comprises a plurality of alternate ridges and grooves which project above and below a notional main plane 316 of the membrane. Each of the ridges and grooves comprises a pair of sidewalls. The membrane exhibits a substantially square-wave shape. The peak of each ridge/groove comprises a substantially planar surface which extends longitudinally across the membrane.

In this example the membrane comprises first and second sets of electrode pairs 312a and 312b. However, in this example the conductive elements of the electrode pairs are provided on the top and bottom peak planes of the ridges and grooves. Such an arrangement is relatively easy to fabricate since the metal or conductive material forming the conductive elements may be readily deposited on the peak planes.

FIG. 6 illustrates in cross-section a number of membrane designs according to various examples embodying the present invention. The membranes are supported in fixed relation to a transducer substrate 620.

FIG. 6a shows a membrane 615 comprising a plurality of arcuate ridges. First and second conductive elements 302a and 302b forming an electrode pair are provided on the sidewalls of a given ridge. This example facilitates the generation of a single output signal.

FIG. 6b shows a membrane 615 comprising a series of alternate ridges and grooves. The membrane is shaped to exhibit a substantially sinuous form. The membrane is provided with first and second sets of electrode pairs 312a and 312b. The conductive elements of the electrode pairs are provided on the peaks of the membrane. The conductive elements forming the second set of electrode pairs 312b are thus provided on the negative peak, or trough, that is below the notional main plan of the membrane. This example facilitates the generation of two output signals—one from each of the sets of electrode pairs 312a and 312b—and thus the generation of a differential signal that advantageously allows electrical noise present in the output signal to be eliminated by common mode rejection.

FIG. 6c shows a membrane comprising a plurality of rectangular shaped ridges. First and second conductive elements 302a and 302b forming an electrode are provided on the peak surfaces of adjacent ridges.

FIG. 6d shows a membrane shaped to comprise a plurality of alternate ridges and grooves. The membrane exhibits a truncated triangular form. As in FIG. 6b, the membrane is provided with first and second sets of electrode pairs 312a and 312b. The conductive elements of the electrode pairs are provided on the peaks of the membrane. In this example, two of the conductive elements of each set of electrode pairs are shared by two, adjacent, electrode pairs. This example facilitates the generation of two output signals—one from each of the sets of electrode pairs 312a and 312b—and thus the generation of a differential signal that advantageously allows electrical noise present in the output signal to be eliminated by common mode rejection.

Figure 7A:
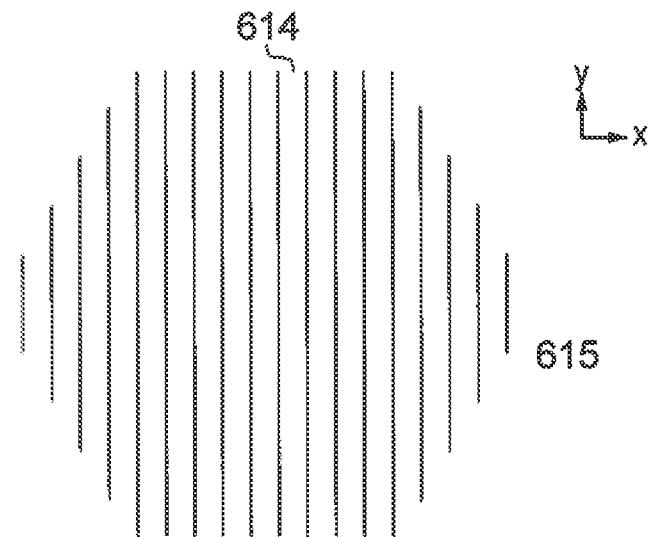
FIGS. 7a and 7b each illustrate a plan view of a membrane design according to examples embodying the present invention.
Figure 7B:
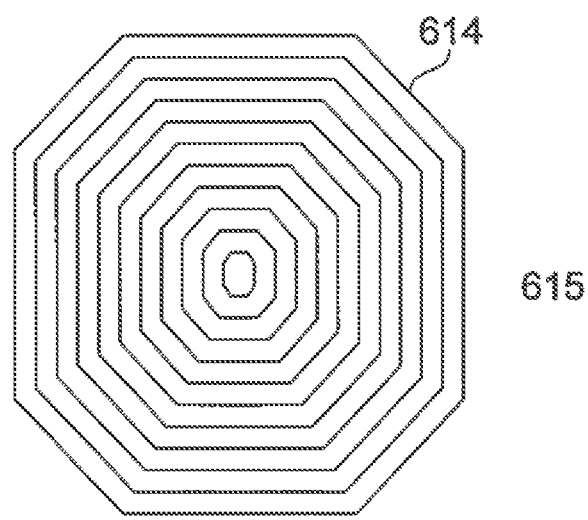

FIGS. 7a and 7b each illustrate a plan view of a membrane design according to examples embodying the present invention. The lines drawn on FIGS. 7a and 7b represent the peaks of the groove and/or ridges of the membrane. Although drawn as a line, it will be appreciated that the peaks may actually comprise a planar surface such as that shown in FIG. 3c, when the membrane is shaped to provide a plurality of ridges and/or grooves having a generally square wave profile or having a truncated triangular wave profile.

As shown in FIG. 7a, the peaks of the plurality of ridges extend linearly across the membrane which will be anchored with respect to the underlying membrane (not shown). The ridges can be considered to define a longitudinal axis, wherein the axes of the ridges are substantially parallel and generally aligned in a first direction. It is envisaged that the plurality of ridges may alternatively define a plurality of curved lines.

As shown in FIG. 7b the peaks of each of the plurality of ridges may define a closed circle or polygon—in this case a rectangle—which are arranged radially with respect to the membrane centre. The size of each of the rectangles defined by the peaks increases from a region at or near the centre of the membrane towards the periphery of the membrane. Thus, the FIG. 7b embodiment can be considered to comprise a plurality of concentric corrugations. The peaks may be symmetrically arranged about a common axis of symmetry, with the centre of the membrane or alternatively the membrane may be shaped so that the peaks follow the shape of the perimeter of the membrane.

Embodiments of the present invention facilitate the generation of measurable capacitance laterally across the membrane. Thus, first and second conductive elements are provided at different lateral positions on the membrane.

Figure 8:
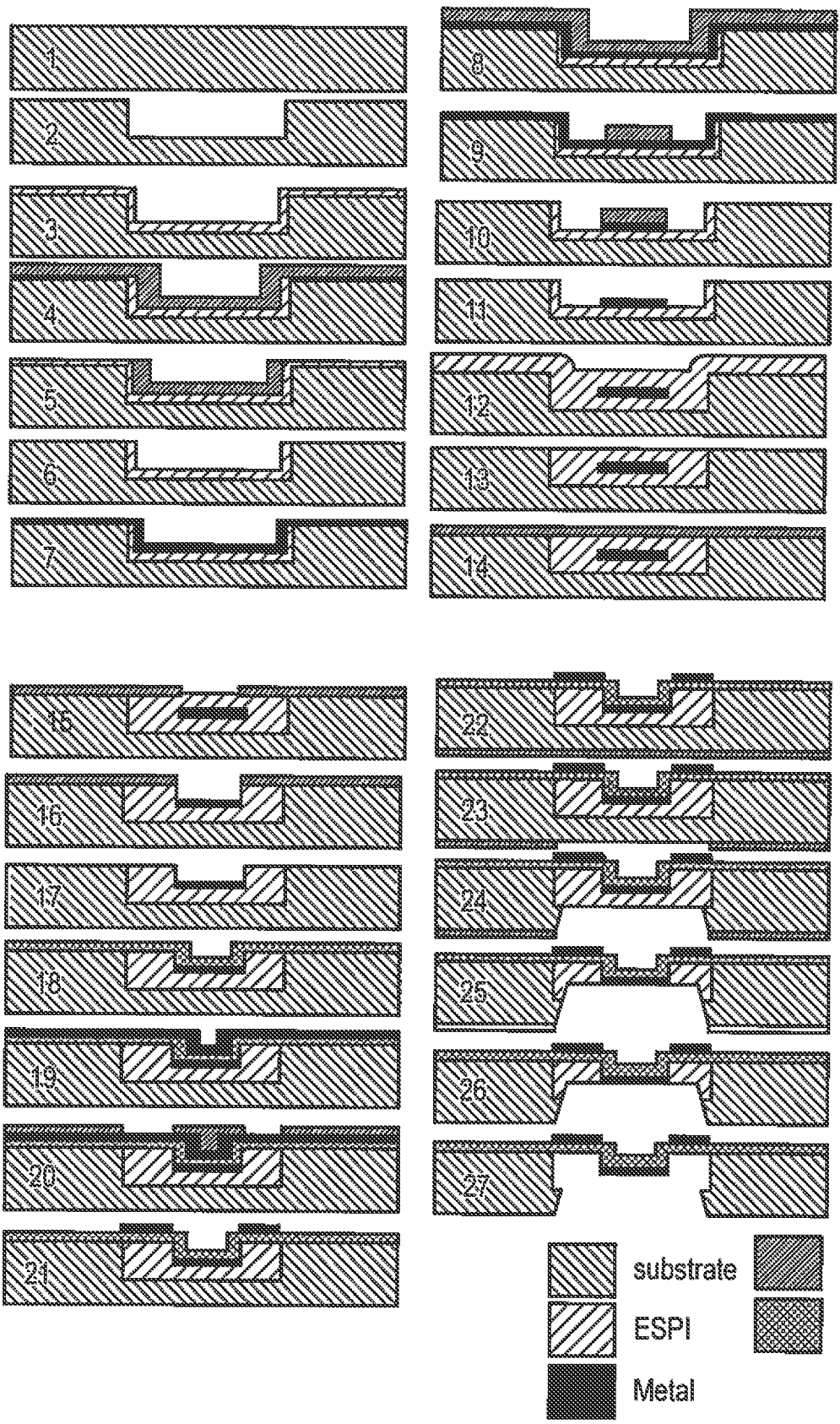
FIG. 8 illustrates steps of a process flow for a non-planar membrane according to an embodiment of the present invention.

FIG. 8 illustrates a sequence of steps—numbered 1 to 27—of a process flow for fabricating a non-planar membrane having a single corrugation, or groove, according to an embodiment of the present invention. For clarity, only a single corrugation is illustrated in this figure.

Step 1: Bare silicon substrate is provided.

Step 2: A Resist (not shown) is laid down on one side—termed the front side for the purposes of this explanation—of the substrate and is patterned. A timed etch is performed into the Si substrate. The depth of this etch should be deeper than the proposed corrugation.

Step 3: A thin layer of polyimide (PI) is spun onto the wafer. This step plays a role in controlling the depth of corrugation and subsequently acts as an Etch Stop (ESPI) in a subsequent back etch through the substrate (step 23).

Step 4: A resist layer is laid down prior to planarization.

Step 5: Resist layer is patterned.

Step 6: Front side is planarized by Chemical-Mechanical Planarization (CMP) and then the resist is removed.

Step 7: A corrugation stop layer is laid down. The material used for the corrugation stop should ideally have high selectivity to both PI and Si etch chemistries. For example, aluminium/titanium may be used. This material may also eventually become an electrode on the lower side of the corrugation. The thickness of the corrugation stop will affect the final depth of the corrugation.

Step 8: A further resist layer is deposited.

Step 9: The resist is patterned.

Step 10: The corrugation stop is etched.

Step 11: The resist is removed.

Step 12: A further PI layer is spun over the corrugation stop.

Step 13: A further CMP planarization is performed.

Step 14: A further resist layer is deposited.

Step 15: The resist is patterned.

Step 16: The PI layer is etched down onto the corrugation stop. The corrugation stop serves to define the end point of the etch.

Step 17: The resist is removed.

Step 18: A layer of Silicon Nitride is deposited on the front surface creating a membrane layer having a corrugation.

Step 19: Metal to form one or more conductive element(s) is deposited on top surface.

Step 20: A resist layer is spun and patterned.

Step 21: The top metal layer is etched to define two conductive elements. (again, important to link terminology—conductive elements—to this process flow).

Step 22: A resist mask is deposited on the other side of the substrate—referred to as the back side for the purposes of this explanation.

Step 23: Back side resist is patterned.

Step 24: Back side etch to polyimide which acts as an end point for this etch.

Step 25: Remove Back side resist.

Step 26: Further backside etch terminating at the corrugation stop.

Step 27: Residual polyimide is etched away to fully release the membrane.

Thus according to embodiments of the present invention, a method of fabricating a non-planar flexible membrane comprising at least one conductive element, comprises:

forming a first cavity in the upper surface of a substrate (steps 1-2: which may e.g. be referred to as a "front-side etch" process);

providing a first sacrificial layer of material within the cavity (steps 3-6);

providing a first patterned layer of conductive/metal material on top of the sacrificial layer within the cavity (steps 7-11);

providing a second sacrificial layer of material within the cavity (steps 12-13) and removing the second sacrificial layer in regions overlying the first patterned layer of conductive/metal material to define a second cavity (within the first cavity) above the patterned layer of conductive/metal material (steps 12-16); and depositing a layer of membrane material (e.g. SiN) over the first cavity including over the second cavity (steps 17-18).

Thus, steps 1 to 18 result in the formation of a non-planar membrane layer having a corrugation (a corrugated membrane layer), wherein a conductive element is provided on the underside of the corrugation. Thus, the first layer of conductive metal material is for forming at least one conductive elements on the "underside" of the membrane layer.

Subsequently, according to a preferred embodiment of the present invention, the method may comprise:

providing a second layer of conductive/metal material on top of the corrugated membrane layer (step 19);

patterning the second layer of conductive/metal material to define at least one further conductive element.

Thus, the additional steps 19 and 20 result in the formation of a non-planar membrane layer having at least one conductive element provided on both the "upper" and "lower" surfaces of the corrugated membrane layer.

Subsequently, according to a preferred embodiment of the present invention, the method further comprises:

forming a cavity in the lower surface of the substrate (steps 22-24 which may be referred to as e.g. a "backside etch" process);

removing the first and second sacrificial layers to release the corrugated layer of membrane material (steps 25 to 27).

It will be appreciated that the number of corrugations (ridges and/or grooves) as well as the number of conductive elements provided on each side of the membrane layer will depend on the intended design of the membrane layer. For example, the method may be readily adapted to provide at least one electrode pair on just one side of the membrane without providing any conductive elements on the other side. First and second conductive elements forming an electrode pair will preferably be located with respect to the corrugation(s) such that the first and second conductive elements are displaced relative to each other when the flexible membrane deflects in response to a pressure differential across the membrane.

It should be understood that the directions provided should not be in any way construed as limiting to any particular orientation of the transducer during any fabrication step and/or its orientation in any package, or indeed the orientation of the package in any apparatus. The relative terms "upper", "lower", "above", "below", "underside", "underneath" etc. shall be construed accordingly.

Embodiments of the present invention are particularly applicable to MEMS sensor transducers, especially capacitive transducers such as MEMS microphones and MEMS speakers. It will also be appreciated that other types of MEMS capacitive sensors could be implemented, for example accelerometers, pressure sensors, proximity sensors or flow meters.

Embodiments may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A MEMS transducer comprising:
    a flexible membrane provided with an electrode pair, the electrode pair comprising first and second conductive elements;
    the flexible membrane comprising a series of peaks, wherein serially adjacent peaks are separated by a side wall portion, and wherein the first conductive element is provided on a first peak and the second conductive element is provided on a second peak; and
    wherein the first and second conductive elements are displaced relative to each other when the flexible membrane deflects in response to a pressure differential across the membrane.

2. A MEMS transducer as claimed in claim 1, wherein the membrane is shaped to include a series of alternate ridges and grooves.

3. A MEMS transducer as claimed in claim 1, comprising a plurality of electrode pairs.

4. A MEMS transducer as claimed in claim 3, wherein the plurality of electrode pairs form a single set of electrode pairs and wherein the transducer is arranged/operable to provide a single output signal representing the change in capacitance between first and second conductive elements of the single set of electrode pairs.

5. A MEMS transducer as claimed in claim 3, wherein the plurality of electrode pairs form first and second sets of electrode pairs, and wherein the transducer is arranged/operable to provide corresponding first and second output signals representing the change in capacitance between first and second conductive elements of each respective set.

6. A MEMS transducer as claimed in claim 1, wherein a bias voltage is applied to one or more of the conductive elements of an electrode pair.

7. A MEMS transducer as claimed in claim 1, wherein the flexible membrane is supported in a fixed relation relative to a substrate.

8. A MEMS transducer as claimed in claim 1, wherein the flexible membrane comprises a crystalline or polycrystalline material, such as silicon nitride.

9. A MEMS transducer as claimed in claim 1, wherein said transducer comprises a capacitive sensor such as a microphone or a speaker.

10. A MEMS transducer comprising:
    a flexible membrane provided with an electrode pair, the electrode pair comprising first and second conductive elements;
    the flexible membrane comprising a series of peaks, wherein serially adjacent peaks are separated by a side wall portion, and wherein the first conductive element is provided on a first side wall portion and the second conductive element is provided on a second side wall portion; and
    wherein the first and second conductive elements are displaced relative to each other when the flexible membrane deflects in response to a pressure differential across the membrane.

11. A MEMS transducer as claimed in claim 10, wherein the membrane is shaped to include a series of alternate ridges and grooves.

12. A MEMS transducer as claimed in claim 10, comprising a plurality of electrode pairs.

13. A MEMS transducer as claimed in claim 12, wherein the plurality of electrode pairs form a single set of electrode pairs and wherein the transducer is arranged/operable to provide a single output signal representing the change in capacitance between first and second conductive elements of the single set of electrode pairs.

14. A MEMS transducer as claimed in claim 12, wherein the plurality of electrode pairs form first and second sets of electrode pairs, and wherein the transducer is arranged/operable to provide corresponding first and second output signals representing the change in capacitance between first and second conductive elements of each respective set.

15. A MEMS transducer as claimed in claim 10, wherein a bias voltage is applied to one or more of the conductive elements of an electrode pair.

16. A MEMS transducer as claimed in claim 10, wherein the flexible membrane is supported in a fixed relation relative to a substrate.

17. A MEMS transducer as claimed in claim 10, wherein the flexible membrane comprises a crystalline or polycrystalline material, such as silicon nitride.

18. A MEMS transducer as claimed in claim 10, wherein said transducer comprises a capacitive sensor such as a microphone or a speaker.

* * * * *